United States Patent
Balasubramanian et al.

(10) Patent No.: US 8,901,968 B2
(45) Date of Patent: Dec. 2, 2014

(54) ACTIVE PULL-UP/PULL-DOWN CIRCUIT

(71) Applicant: Texas Instruments Incorporated, Dallas, TX (US)

(72) Inventors: Lakshmanan Balasubramanian, Karnataka (IN); Ranjit Kumar Dash, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 13/930,087

(22) Filed: Jun. 28, 2013

(65) Prior Publication Data

US 2013/0285451 A1  Oct. 31, 2013

Related U.S. Application Data

(62) Division of application No. 13/218,483, filed on Aug. 26, 2011, now Pat. No. 8,497,725.

(51) Int. Cl.
| | |
|---|---|
| *H03M 1/00* | (2006.01) |
| *H03L 5/00* | (2006.01) |
| *H02J 1/00* | (2006.01) |
| *H03K 19/00* | (2006.01) |

(52) U.S. Cl.
CPC ............. *H02J 1/00* (2013.01); *H03K 19/0013* (2013.01)
USPC ................. 327/101; 327/333; 326/62; 326/81

(58) Field of Classification Search
USPC .......... 326/80–81, 62–63; 327/306, 333, 112, 327/101
See application file for complete search history.

(56) References Cited

U.S. PATENT DOCUMENTS

| | | | |
|---|---|---|---|
| 7,679,420 B1 * | 3/2010 | Burkland et al. | 327/333 |
| 8,497,725 B2 * | 7/2013 | Balasubramanian et al. | 327/333 |
| 8,664,997 B2 * | 3/2014 | Ji | 327/333 |
| 2002/0003446 A1 * | 1/2002 | Kanda et al. | 327/333 |

* cited by examiner

*Primary Examiner* — Dinh Le
(74) *Attorney, Agent, or Firm* — John R. Pessetto; Frederick J. Telecky, Jr.

(57) ABSTRACT

A circuit includes circuit portions operating from separate power supplies which are switched sequentially. An output of a first portion powered by a power supply (A) is provided as an input to a second portion powered by another power supply (B). Power supply (A) is switched-ON a delay interval later than power supply (B). In an embodiment, the first portion also receives a control input which enables or disables response of the first portion to changes in its inputs. An active circuit is connected between the control terminal and a constant reference potential node of the circuit, and has one transistor of a current-mirror pair connected across supplies (A) and (B). The active circuit connects the control terminal to the constant reference potential node in the delay interval, but is an open circuit otherwise. Power dissipation in the circuit is thereby reduced.

3 Claims, 5 Drawing Sheets

ACTIVE PULL-UP/PULL-DOWN CIRCUIT

This Application is a Divisional of prior application Ser. No. 13/218,483, filed Aug. 26, 2011, currently pending.

BACKGROUND

1. Technical Field

Embodiments of the present disclosure relate generally to electronic circuits, and more specifically to an active pull-up or pull-down circuit.

2. Related Art

Pull-up and pull-down circuits are often used to connect nodes in a circuit to logic high and logic low levels respectively. Active pull-up and pull-down circuits are implemented using active components such as transistors.

Active pull-up/pull-down circuits may need to be designed to address specific circuit problems and deployment environments. In addition, active pull-up/pull-down circuits may also need to be designed to address other requirements such as, for example, acceptable implementation area, fast circuit response times, etc.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An active circuit has a first terminal and a second terminal for receiving corresponding voltages for operation. The circuit includes a first MOS transistor, a second MOS transistor, a third MOS transistor and a fourth MOS transistor. The first MOS transistor has a first current terminal coupled to the second terminal, a second current terminal coupled to the first terminal, and a control terminal coupled to the first terminal. The second MOS transistor has a first current terminal coupled to the second terminal and a control terminal coupled to the control terminal of the first MOS transistor. The third MOS transistor has a first current terminal coupled to a second current terminal of the second MOS transistor, a control terminal coupled to the first current terminal of the third MOS transistor, and a second current terminal coupled to a constant reference potential node. The fourth MOS transistor has a first current terminal coupled to the constant reference potential node, a control terminal coupled to the control terminal of the third MOS transistor, and a second current terminal The second current terminal of the fourth MOS transistor provides a low-impedance conduction path to the constant reference potential node if a voltage at the second terminal exceeds a voltage at the first terminal by a pre-determined value, the second current terminal of the fourth MOS transistor being electrically decoupled from the constant reference potential node otherwise.

In an embodiment, the active circuit is used for minimizing power dissipation due to power-supply sequencing. A circuit includes a first circuit portion, a second circuit portion and the active circuit. The first circuit portion is coupled to receive a first power supply voltage for operation on a first power supply terminal The first circuit portion is coupled to receive a first input signal, and to generate a first output signal on a first output node. The first circuit portion is also coupled to receive a control signal on a control terminal One logic value of the control signal prevents the first circuit portion from responding to changes in magnitudes of the first input signal, while the other logic value of the control signal enables the first circuit portion to respond to the magnitude changes. The second circuit portion is coupled to receive a second power supply voltage on a second power supply terminal. The second circuit portion is coupled to receive the first output signal as an input, and to generate a second output signal. The first circuit portion receives the first power supply voltage a first time interval later than when the second circuit portion receives the second power supply voltage. The active circuit is coupled between the control terminal of the first circuit portion and a constant reference potential node of the circuit. The active circuit is designed to provide a conduction path between the control terminal and the constant reference potential node in the first time interval, and to be an open circuit otherwise.

In another embodiment, the active circuit is coupled between the first node and the ground terminal of the circuit, and is designed to provide a conduction path between the first node and the ground terminal in the first time interval, and to be an open circuit otherwise.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Component

Figure 1:
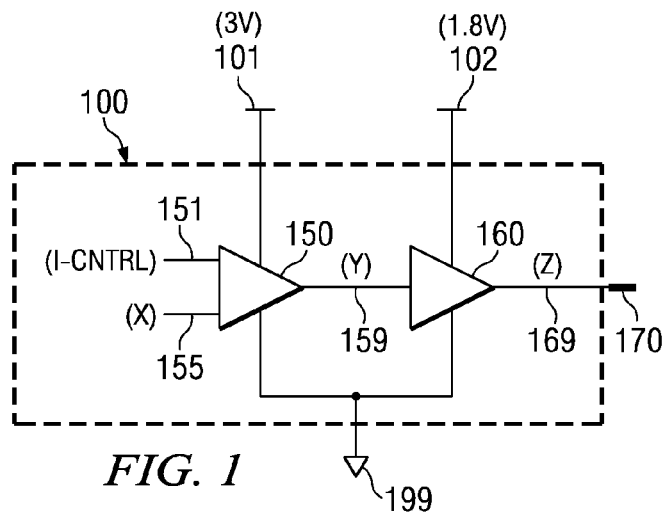
FIG. 1 is a diagram of an example component in which several embodiments can be implemented.

FIG. 1 is a diagram of an example component in which several embodiments can be implemented. Integrated circuit (IC) 100 is shown containing logic blocks 150 and 160. The specific details of IC 100 are shown merely by way of illustration, and IC 100 may contain many more components, digital as well as analog. Further, embodiments of the present disclosure can be implemented in other environments and systems/devices as well. Logic block 150 receives power for operation from power supply 101, while logic block 160 receives power for operation from power supply 102. Supplies 101 and 102 respectively equal 3V and 1.8V in an embodiment. However, in other embodiments, supplies 101 and 102 may have other voltage values, equal or unequal. Further, although described below in the context of digital circuits, the techniques and/or circuit structures described below can be applied in the context of analog and/or mixed-signal circuits operating from multiple power supplies that power-ON/power-OFF sequentially as well. Terminal 199 represents a ground terminal of IC 100.

Logic block 150 (first circuit portion/first logic block) is powered by supply 101, receives a digital (binary) input (X) on path 155, and provides a corresponding digital (binary) output (Y) on path 159 (first output node). Output Y may be provided either as some logical combination of input X with another logic input (not shown) to logic block 150, as a buffered version of input X, as a logic operation (such as logic inversion) not requiring another input, etc. Logic block 150 may contain level-conversion circuitry to generate output (Y) from input (X), and may additionally receive power supply 102, although not indicated in the Figures. Logic block 160 (second circuit portion/second logic block) operates in a similar manner, taking signal Y as input and providing digital (binary) signal Z on path 169 as output. Output 169 may be connected to an external pin 170 of IC 100. Logic block 160 is powered by supply 102.

Isolation-control (I-CNTRL) signal 151 (control signal) is also provided as an input to logic block 150. I-CNTRL may be generated by a component or block, not shown in FIG. 1. Control signal I-CNTRL controls whether logic block 150 responds to changes in logic values (magnitude in general) of input signal X. One logic value (e.g., logic low or logic zero) of I-CNTRL prevents logic block 150 from responding to changes in signal X, while the other logic value (e.g., logic high or logic one) of I-CNTRL enables logic block 150 to respond to changes in X (as reflected in the value of signal Y). The control effected by I-CNTRL may be viewed as a logical AND operation between I-CNTRL and signal X, although the specific internal implementation in logic block 150 may not be an AND function. I-CNTRL may be generated as the output of another component or circuit within IC 100, not shown in FIG. 1.

Figure 2:
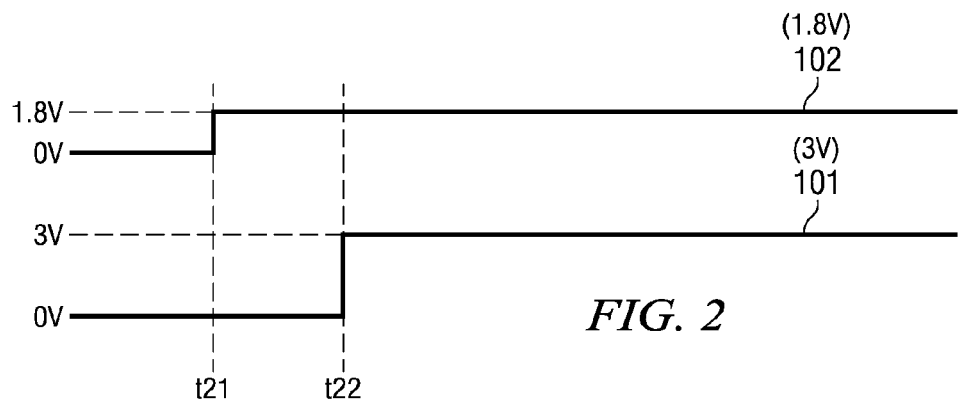
FIG. 2 is a diagram illustrating an example power-ON sequence of power supplies in an embodiment.

In several operating environments, such as for example, when IC 100 is used as part of a system or device containing other ICs and/or components, a specific sequence for power-up (power-ON) and/or power-down (power-OFF) of power supplies 101 and 102 may be used. Such power-supply sequencing may be required, for example, to prevent damage to one or components in the system, or for proper initialization of the modules in the system, etc. FIG. 2 shows a power-ON sequence for supplies 101 and 102, in which power supply 102 is applied (or powered-ON) at a time instance (t21) earlier than power-ON of power supply 101 (t22).

In the example operating scenario of FIG. 2, input X, and therefore output Y, of logic block 150 are in the floating (indeterminate) state till time instance t22, since supply 101 is powered-ON only at t22. Y being in the floating state may lead to power dissipation in logic block 160 in the interval t21 to t22 (first time interval). For example, and as is well-known, if the input of logic block 160 is a CMOS stage, the floating value of Y may result in both the P-type and N-type transistors of the CMOS stage to be ON (or intermittently ON) resulting in a short between supply 102 and ground 199. Such power dissipation may be unacceptable. For example, when IC 100 is used in hand-held or mobile battery-powered devices, such power dissipation may require frequent battery recharging.

Figure 3:
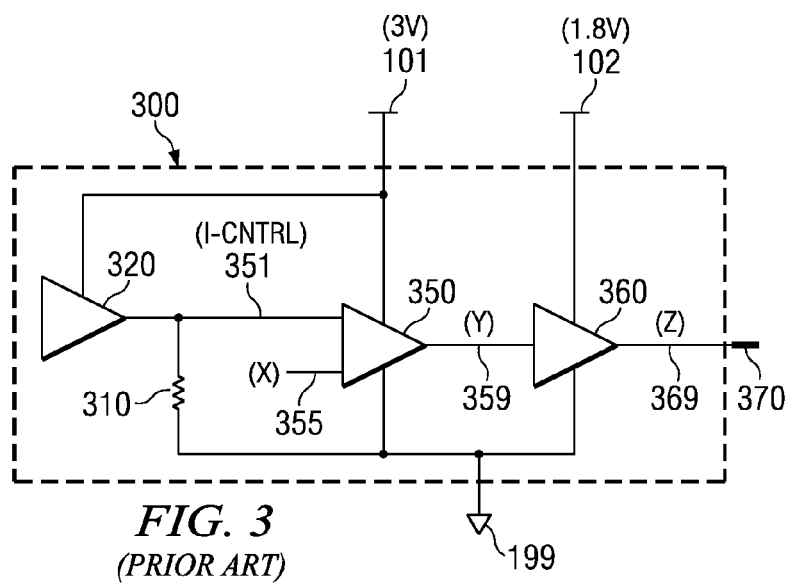
FIG. 3 is a diagram illustrating a prior technique for reducing power dissipation caused due to power-supply sequencing.

FIG. 3 is a diagram illustrating a prior technique to reduce power dissipation that may otherwise be caused due to power-supply sequencing. In FIG. 3, logic blocks 350 and 360 correspond respectively to logic block 150 and 160 of FIG. 1, with signals 355, 359 and 369 corresponding respectively to signals 155, 159 and 169 of FIG. 1. Isolation control (I-CNTRL) is shown as being generated on path 351 by driver 320. Driver 320 is also powered by supply 101.

In the prior approach, in IC 300, I-CNTRL (351) is permanently pulled-down to ground 199 via resistor 310. With I-CNTRL at logic low, output Y is also at logic low, and the power dissipation problem due signal Y being in a floating state (when supply 102 is ON) is overcome. The value of resistance of resistor 310 is selected such that I-CNTRL can be driven to logic high by driver 320 once power supply 101 is switched ON. With I-CNTRL at logic high, logic block 350 can respond to changes in the values of X, to generate correct value of Y. In some other prior approaches, node 351 is pulled to ground via an active device, such as a current source.

In the prior techniques noted above, a problem that still persists is that some power is still dissipated either in resistor 310 and/or in the active device used to pull node 351 to ground. For example, resistor 310 may need to be a weak pull-down (i.e., have a relatively high resistance) to enable node 351 to be pulled to logic high (logic one) by driver 320 when power supply 101 is ON. A high resistance value for resistor 310 may translate to longer response time for the pull-down to take effect due to the presence of parasitic capacitance (not shown) in parallel with resistor 310. Response time can be reduced by lowering the resistance of resistor 310. However, a low resistance value translates to higher current consumption, and may conflict with the requirement of pull-up by driver 320.

Embodiments of the present disclosure overcome the problems noted above, as described next with examples.

2. Reducing Power Dissipation

Figure 4:
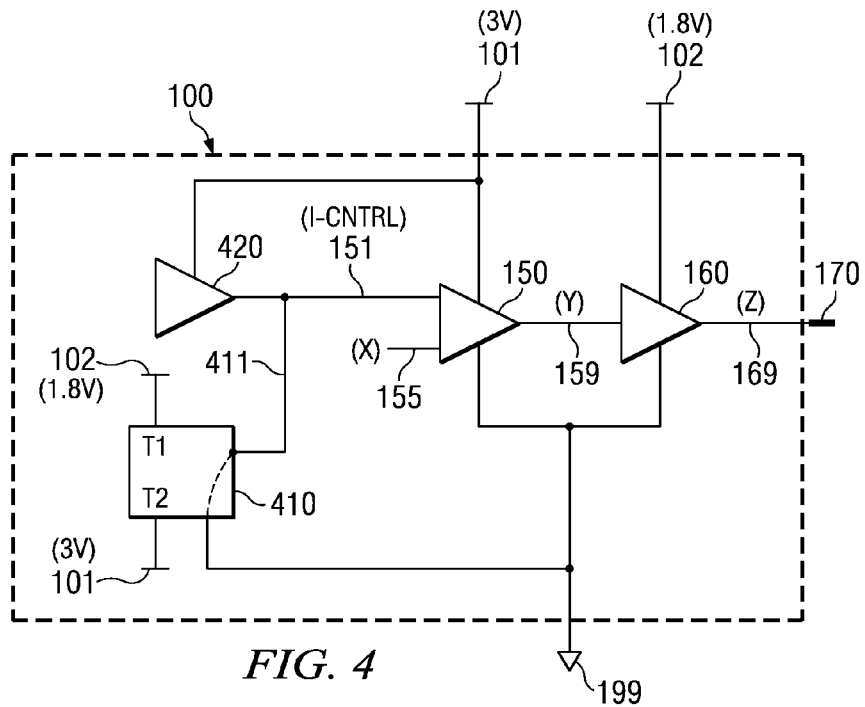
FIG. 4 is a block diagram illustrating the manner in which power dissipation due to power supply sequencing is reduced in an embodiment.

FIG. 4 is a block diagram illustrating the manner in which power dissipation due to power supply sequencing is reduced in an embodiment. IC 100 of FIG. 1 is shown in FIG. 4, with the addition of circuit 410 (active circuit) and the corresponding connections. Driver 420 is also shown, and operates similar to driver 320 of FIG. 3. As shown in FIG. 4, circuit 410 receives power supplies 102 and 101 on respective terminals T1 (first terminal) and T2 (second terminal). When the supply received on terminal T1 is greater than the supply on terminal T2 (such as in interval t21 to t22 of FIG. 2), circuit 410 is designed to pull node 151 to ground 199 (as indicated by the dotted curve inside circuit 410), thereby operating to maintain signal Y in a known state, and thus reducing power consumption that would otherwise occur if node Y floats in interval t21 to t22.

However, in the steady-state when both power supplies 101 and 102 are ON, circuit 410 is designed to be non-operational, and node 151 is decoupled from (i.e., not electrically connected to) circuit 410. Thus, when both of supplies 101 and 102 are ON, driver 420 can drive I-CNTRL to logic high, without resulting in any current flow via node 411 and circuit 410 to ground 199. In particular, circuit 410 is operative only when the difference between the voltages on respective power supply nodes 102 and 101 is greater than a positive threshold, the value of the positive threshold being determined by the implementation details of circuit 410.

Figure 5:
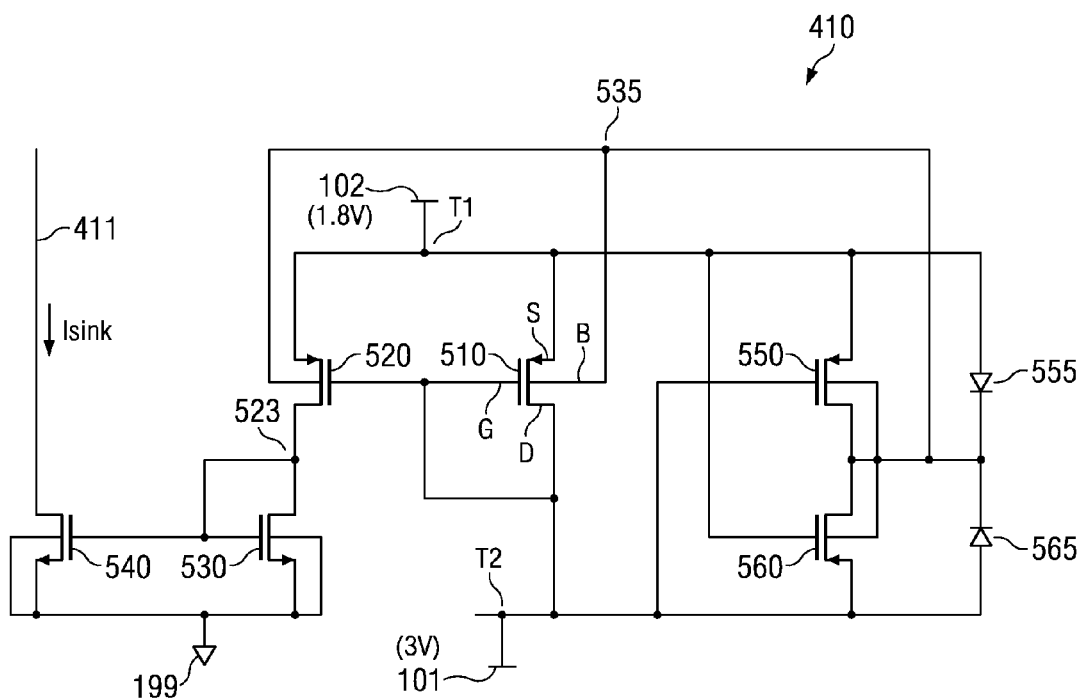
FIG. 5 is a circuit diagram illustrating the details of a pull-down circuit in an embodiment.

FIG. 5 is a circuit diagram illustrating the details of circuit 410 in an embodiment. Circuit 410 is shown containing current P-type metal oxide semiconductor (PMOS) transistors 510, 520, 550 and 560, N-type MOS (NMOS) transistors 530 and 540, and diodes 555 and 556. The source, drain, gate and bulk (substrate) terminals of PMOS 510 are respectively marked S, D, G and B. Terminals of the other transistors are not marked, but can be identified by the corresponding transistor symbol conventions.

The source terminals of PMOS 510 and 520 are each connected to power supply 102 (received on terminal T1). PMOS 510 is in diode-connected configuration, with its gate and drain terminals shorted to each other. The drain terminal of PMOS 510 is connected to power supply 101 (received on terminal T2). PMOS 510 and 520 form a current mirror pair (first current-mirror pair).

The source terminals of NMOS 530 and 540 are each connected to ground terminal 199. NMOS 530 is in diode-connected configuration, with its gate and drain terminals shorted to each other. The drain terminal of NMOS 530 is connected to the drain terminal of PMOS 520. NMOS 530 and 540 form a current mirror pair (second current-mirror pair).

In operation, PMOS 510 switches-ON when the gate-to-source voltage Vgs is larger than Vt (threshold voltage of PMOS 510). Vt is typically about 1V. Thus, at time instance t21 shown in FIG. 2 (or when power supply voltage 102 crosses the threshold voltage Vt, assuming finite power-ON time for supply 102), PMOS 510 switches-ON. As a result, PMOS 520 also switches-ON, with the current flowing through PMOS 520 either equaling or having a scaled magnitude of the current flowing through PMOS 510, depending on the relative dimensions (length L and width W) of the two transistors 510 and 520. The current that flows through NMOS 530 equals the current that flows through PMOS 520.

NMOS 530 and 540 being a current mirror pair, the current (Isink) sunk by NMOS 540 is equal to (or is a scaled version of) the current flowing through NMOS 530. Thus, when node 411 of circuit 410 is connected to I-CNTRL (151) of FIG. 1, circuit 410 pulls node I-CNTRL to ground 199, and therefore a logic low.

At time instance t22 shown in FIG. 2 (or, assuming finite power-ON time for supply 102, when power supply voltage 101 reaches a positive value such that Vgs of PMOS 510 becomes less than or equal to Vt,), PMOS 510 switches-OFF. As a result, each of transistors 520, 530 and 540 is also switched OFF, and node 411 is in a floating state. Node I-CNTRL (151) may then be pulled to logic high by a corresponding driver contained within IC 100, without any current dissipation incurred (ignoring leakage currents in circuit 410).

While power supply voltages 101 and 102 are assumed in the example above as 3.3V and 1.8V respectively, with supply 102 powering-ON earlier than supply 101, other power supply voltages values as well as power-ON sequences can also be supported by the techniques described above. Referring to the power supply voltage that powers up earlier as Vearly, and the power supply voltage that powers up later as Vlate, the techniques described below can be applied for other values of Vearly and Vlate, with the limitation that Vearly be greater than Vt of the transistors of circuit 410 (in durations in which Vearly is ON but Vlate is OFF) for the pull-down to be effected by circuit 410, and that Vearly-Vlate be less than or equal to Vt for the pull-down to be disabled (once both Vearly and Vlate are ON).

Several benefits of circuit 410 may now be apparent. When connected as shown in FIG. 4, circuit 410 consumes (or dissipates) power only when only power supply 102 is ON and power supply 101 is OFF. In practice, circuit 410 is operational and dissipates power only when the difference between the voltages on respective power supply nodes 102 and 101 is greater than a positive threshold (leakage current in circuit 410 of FIG. 5 being ignored). When implemented as shown in FIG. 5, the positive threshold equals the threshold voltage Vt of PMOS 510.

Figure 8:
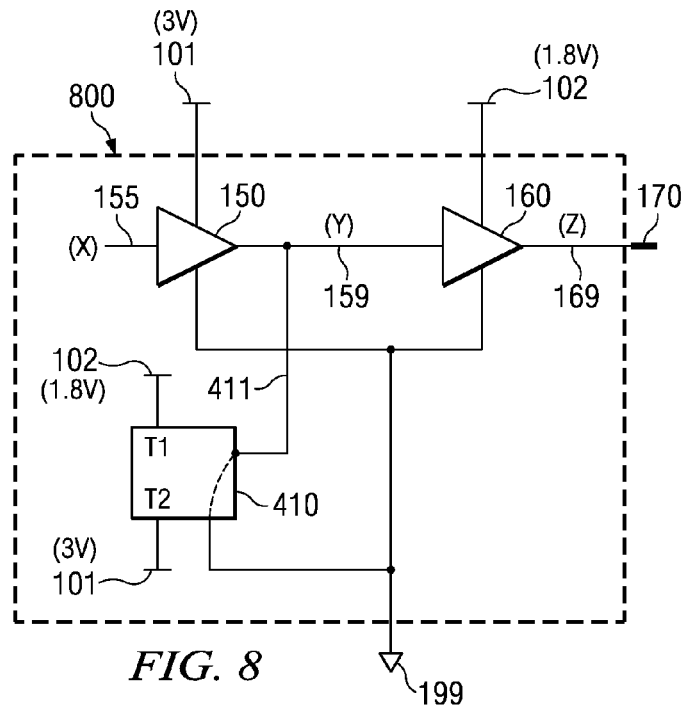
FIG. 8 is a block diagram illustrating the manner in which power dissipation due to power supply sequencing is reduced in an alternative embodiment.

It is noted that if a pull-up is required at node I-CNTRL, transistors 530 and 540 are not implemented in circuit 410, and node 523 is instead connected to I-CNTRL. Further, in other embodiments, node 411 (or node 523 depending on whether a pull-up or pull-down is required) may be connected to path 159 (FIG. 4) rather than to node I-CNTRL (the control mechanism provided by I-CNTRL may not be implemented in such embodiments) to achieve the same effect of reducing power dissipation. Such an example embodiment (IC 800) is shown in FIG. 8. In IC 800, node 411 of circuit 410 is shown connected to path 159(Y), and I-CNTRL is not shown (but may be present).

Another advantage of using circuit 410 is that the response-time (or discharge time) may be made very small (by suitably designing circuit 410 to provide a desired value of Isink). Thus, there are no conflicting design requirements with respect to ON-state current (and hence discharge time) versus OFF-state current consumption. There is no substantial implementation-area versus OFF-state-current-consumption trade-off either.

PMOS 550 and 560, diodes 555 and 565, and the corresponding connections operate to maintain the bulk terminals of PMOS 510 and 520 at the highest positive voltage in circuit 410. Assuming that power supply voltages 101 and 102 respectively equal 3V and 1.8V, when supply 102 is ON and supply 101 is OFF, PMOS 550 is ON while PMOS 560 is OFF. As a result, node 535 (which is connected to bulk terminals of PMOS 510, 520, 550 and 560) receives 1.8V. When both supplies 101 and 102 are ON, PMOS 550 is OFF while PMOS 560 is ON. As a result, node 535 receives 3.3V. It is noted that the bulk terminals of NMOS 530 and 540 are connected to ground 199 always. Diodes 555 and 565 and the corresponding connections operate to connect node 535 to the corresponding power-supply when both power supply voltages (101 and 102) have the same value. Diodes 555 and 565 may represent parasitic diodes of respective transistors 550 and 560, or be implemented separately.

It is noted here that when power supplies 102 and 101 are sequentially powered down, with supply 101 being powered down prior to supply 102, circuit 410 operates as described above to maintain node I-CNTRL (or the corresponding node to which node 411 is connected) at a known logic state.

Figure 6:
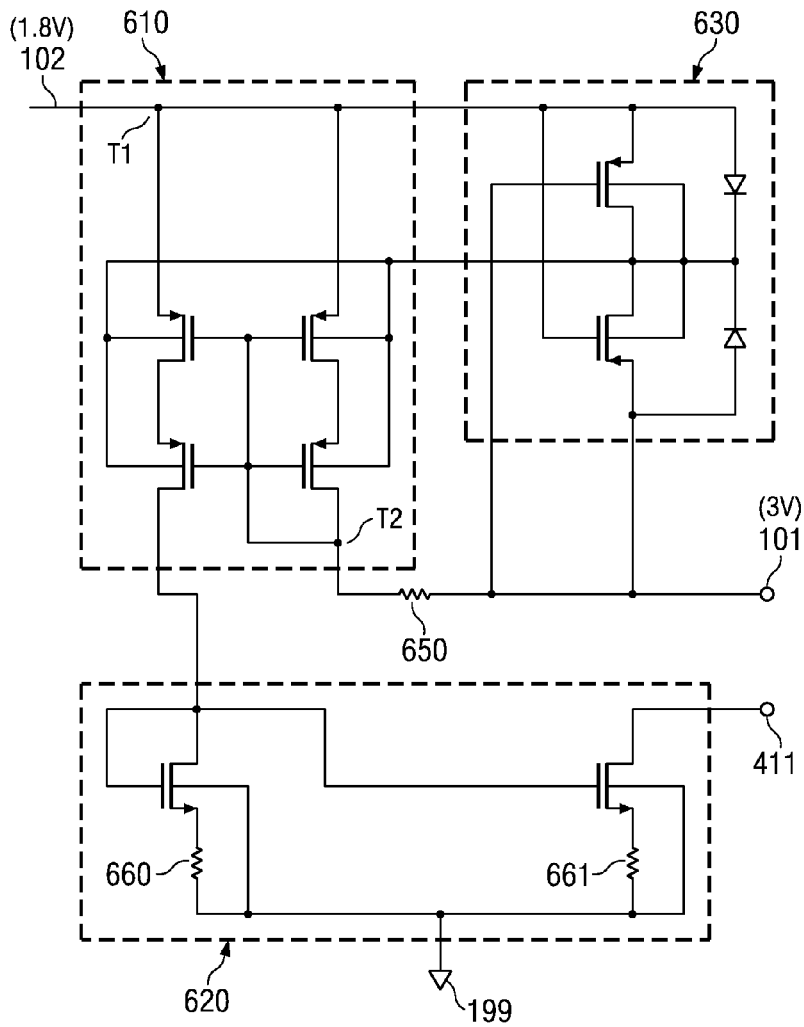
FIG. 6 is a circuit diagram illustrating the details of an active pull-down circuit in another embodiment.

FIG. 6 is a circuit diagram of circuit 410 in another embodiment. Adaptive bulk-bias circuit 630 corresponds to and operates in a manner similar to the corresponding bulk-bias circuit in FIG. 5 formed by PMOS 550, PMOS 560, and diodes 555 and 565. Current mirror pair 620 corresponds to the current mirror pair formed by NMOS 540 and NMOS 530. Resistors 660 and 661 in block 620 operate as source degeneration resistors, and are used to improve the performance of the current mirror pair, by increasing the impedance of the current-mirror pair. Block 610 corresponds to the current mirror pair formed by PMOS 520 and PMOS 510 of FIG. 5. In block 610, two transistors are connected in series in place of each of transistors 520 and 530 to minimize leakage currents. Resistor 650 is used as a current-limiting resistor to reduce leakage currents.

Figure 7:
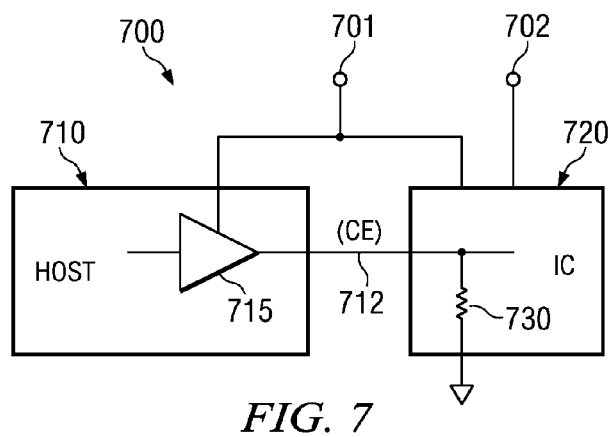
FIG. 7 is a diagram of an example system in which several embodiments can be implemented.

The use of circuit 410 enables reducing power dissipation in IC 100 when the corresponding circuit portions of IC 100 operate from different power supplies switched sequentially. While the description of circuit 410 is provided with respect to an IC (IC 100), circuit 410 (implemented for example in discrete form) can be used in circuits that are implemented using discrete components or a combination of discrete and integrated circuit components) as well. Further, circuit 410 may be used in other environments as well. For example, FIG. 7 illustrates a system (700) in which circuit 410 or its modifications can be used.

System 700 may be implemented to contain several integrated circuits and/or discrete circuits, of which only host 710 and IC 720 are shown. Host 710 generates a chip enable (CE) for other circuits/ICs in system 700. IC 720 receives CE signal on path 712. In system 700, power supply 701 switches ON after power supply 702 is switched ON. To maintain CE signal 712 in a known state when supply 701 is not yet ON, resistor 730 is used as a pull-down to ground. However, when supply 701 switches ON, power is dissipated via driver 715 and resistor 730 for the entire duration of operation of host 710 and IC 720. Assuming supplies 701 and 702 are respectively 3.0V and 1.8V, circuit 410 may be used as a pull-down in place of resistor 730, thereby reducing the power dissipation to be only during the interval in which the supply 701 is OFF and supply 702 is ON.

In other environments, circuit 410 can be used for purposes other than that of minimizing power consumption, as described next with examples.

3. Other Example Applications

Figure 9A:
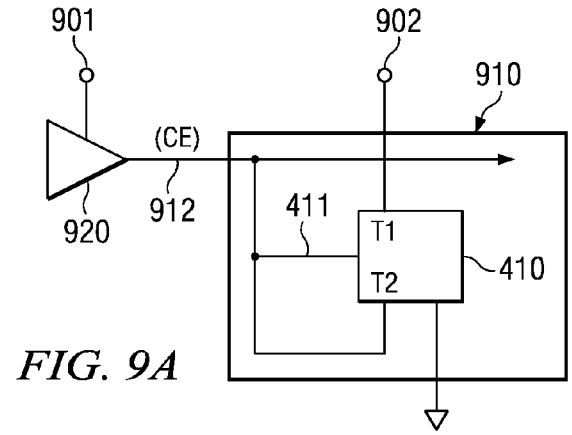
FIG. 9A is a diagram illustrating the use of an active pull-down circuit in an example application.
Figure 9B:
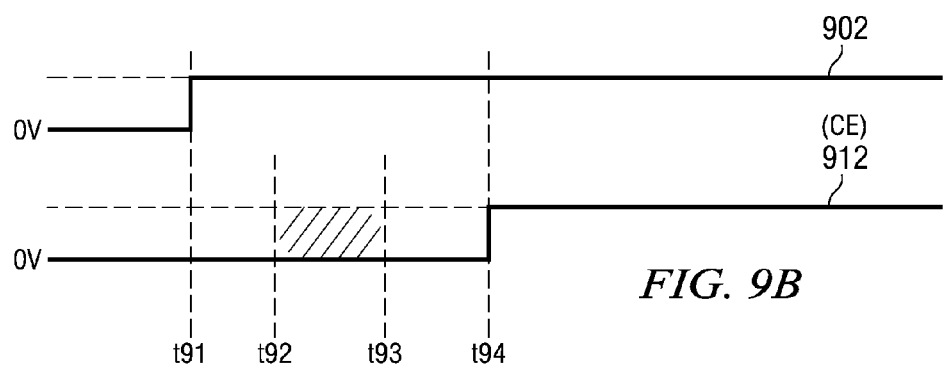
FIG. 9B are waveforms of some nodes in the circuit of FIG. 9A.

FIG. 9A is a diagram illustrating the use of circuit 410 for maintaining a chip enable input of an IC (910) at a known logic level till a power supply generating the chip enable signal stabilizes to a steady-state value after power ON. IC 910 receives a chip enable signal 912 (CE) from buffer 920 contained in a circuit external to IC 910. IC 910 is powered by supply 902, while buffer 920 is powered by supply 901. FIG. 9B illustrates a scenario in which supply 902 powers ON earlier than supply 901. Supply 901 is assumed to be switched-ON at or sometime later than t91, but reaches its steady-state power-ON value only at t94. Supply 901 may be ramping-up during interval t91 to t94.

Buffer 920 internally contains a pull-down circuit (e.g., resistor) to connect node 912 (CE) to ground (0V). Chip enable CE is shown as being at logic low in interval t91-t92. However, since supply 901 is not stabilized till t94, CE may be indeterminate during interval t92-t93, if there is no internal pull-down. CE being indeterminate in interval t92-t93 may result in erroneous operation of IC 910, and in addition result in power undesired power consumption. Once supply 901 stabilizes at t94, CE is asserted to logic high.

Referring now to FIG. 9A, terminal T1 of circuit 410 (contained in IC 910) is connected to supply 902, while terminal T2 is connected to chip enable signal 912 (CE). In interval t91-t92, circuit 410 maintains node 912 at ground, since the pull-down resistance offered by circuit 410 (via terminal 411) is much smaller than the resistance between CE and supply 901. Once CE has been strongly pulled to logic low, logic low state is maintained till circuit 410 switches off when power supply 901 has reached a steady-state value such that potential between T1 and T2 is less than Vt of PMOS 550 within circuit 410. The embodiment of FIG. 9A illustrates a scenario in which one terminal (T1) of circuit 410 is connected to a power supply, and the other (T2) is connected to a signal. While in FIG. 9A, circuit 410 is shown implemented within IC 910, circuit 410 may alternatively be provided external to IC 910, but with connections as shown in FIG. 9A being unchanged.

Figure 10A:
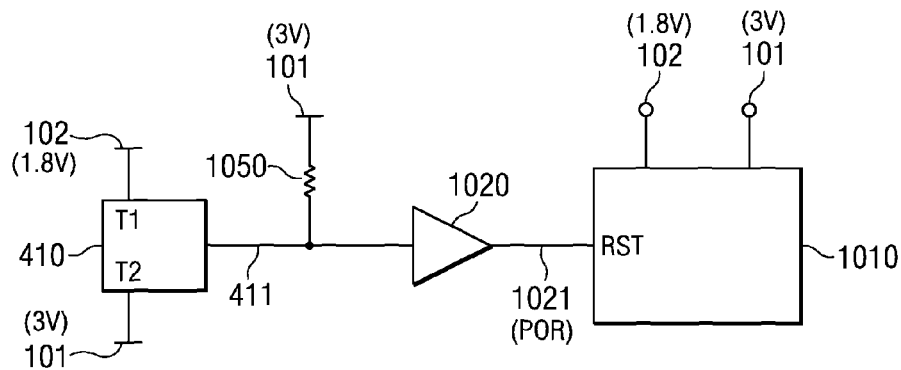
FIG. 10A is a diagram illustrating the use of an active pull-down circuit in another example application.
Figure 10B:
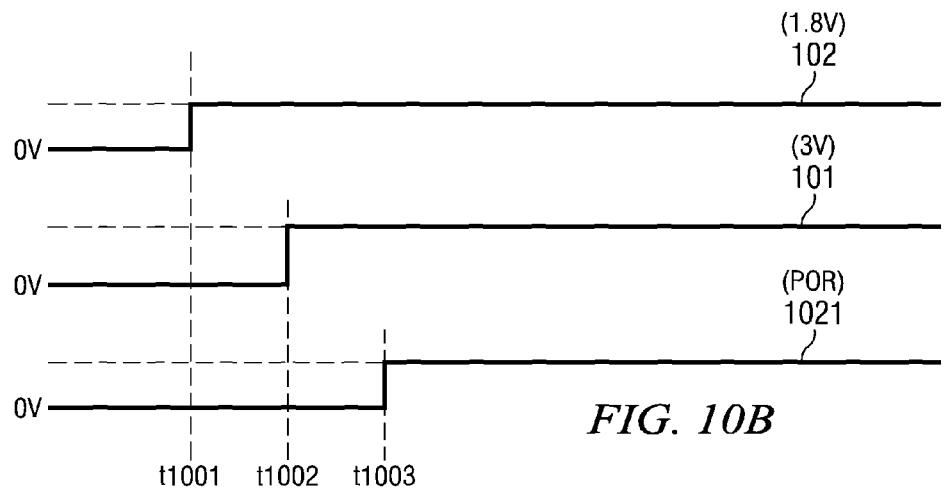
FIG. 10B are waveforms of some nodes in the circuit of FIG. 10A.

In another application, illustrated with respect to FIGS. 10A and 10B, circuit 410 is used to generate a power-on reset (POR) signal for a logic device (IC 1010 in FIG. 10A). IC 1010 is shown receiving power supplies 101 and 102 having voltage values 3V and 1.8V respectively. The specific voltage values are assumed merely by way of illustration. Terminals T1 and T2 of circuit 410 are respectively connected to supplies 102 and 101. Terminal 411 of circuit 410 is pulled up to supply 101 via resistor 1050. The voltage at node 411 is delayed by delay element 1020, whose output is provided as power-on reset (POR) on path 1021 to the reset (RST) terminal of IC 1010. As shown in FIG. 10B, supplies 101 and 102 switch-ON at t1001 and t1002 respectively. Signal 411 is at logic low in interval t1001-t1002. At t1002, signal 411 transitions to logic high. POR represents a delayed version of signal 411 and transitions to logic high at t1003. Circuit 410 thus connected, provides an active-low power-on rest to IC 1010. POR may be inverted to provide an active-high reset.

Figure 11:
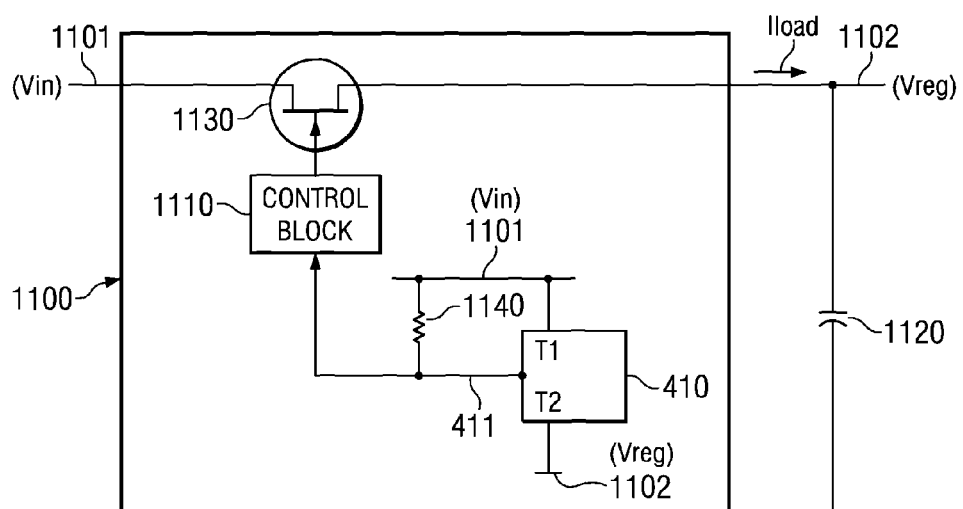
FIG. 11 is a diagram illustrating the use of an active pull-down circuit in yet another example application.

In yet another application, illustrated with respect to FIG. 11, circuit 410 is used to limit in-rush current resulting at power-ON of a power supply. FIG. 11 shows a voltage regulator IC 1100, which is shown containing pass-transistor 1130, control block 1110 and circuit 410. Vin (1101) represents an unregulated voltage, which is regulated by IC 1100 and provided as regulated voltage Vreg (1101). When IC 1100 is switched-ON (with Vin also being ON), capacitance 1120 typically causes a large current, termed in-rush current, to flow through pass-transistor 1130 and capacitor 1120. The in-rush current decreases as capacitor 1120 charges to the steady-state value of Vreg. Terminal T1 of circuit 410 is connected to Vin, and terminal T2 is connected to Vreg. Vreg is initially (at the time of switching-ON of IC 1100) equal to 0V, and at steady-state equals the desired regulated voltage value.

As is well-known in the relevant arts, control block 1110 controls the ON-resistance of pass-transistor 1130 to generate regulated voltage Vreg Immediately following power-ON of IC 1100 (with Vin also ON), the voltage difference between Vin and Vreg exceeds Vt of transistor 510 (FIG. 5), and consequently node 411 is at 0V. A logic zero at node 411 indicates to control block 1110 that current Iload is to be reduced. In response, control block 1110 adjusts the signal provided to pass transistor 1130 to limit the in-rush current to a desired value. The manner in which such control is provided by control block 1110 would be apparent to one skilled in the relevant arts. Once Vreg reaches its steady state value, signal 411 is pulled to logic high by resistor 1140, and control block 1110 operates in normal fashion to generated Vreg. Again, while in FIG. 11, circuit 410 is shown implemented within IC 1110, circuit 410 may alternatively be provided external to IC 1110, but with connections as shown in FIG. 11 being unchanged.

While in the illustrations of FIGS. 1, 4, 5, 6, 7, 8, 9A, 10A and 11, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals. In the instant application, power supply and ground terminals are referred to as constant reference potential nodes.

It should be appreciated that the specific type of transistors (such as NMOS, PMOS, etc.) noted above with respect to FIGS. 3 and 4 are merely by way of illustration. However, alternative embodiments using different configurations and other types of transistors, such as bipolar junction transistors (BJT) or a combination of MOS and BJT, will be apparent to one skilled in the relevant arts by reading the disclosure provided herein. For example, NMOS transistors and PMOS transistors may be swapped, while also interchanging the connections to power and ground terminals. Accordingly, in the instant application, the source (emitter) and drain (collector) terminals (through which a current path is provided when turned ON and an open path is provided when turned OFF) of transistors are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An active circuit comprising a first terminal and a second terminal, the first terminal and the second terminal to receive corresponding voltages for operation of the active circuit, the circuit comprising:
   a first MOS transistor having a first current terminal coupled to the second terminal, a second current terminal coupled to the first terminal, and a control terminal coupled to the first terminal;
   a second MOS transistor having a first current terminal coupled to the second terminal and a control terminal coupled to the control terminal of the first MOS transistor;
   a third MOS transistor having a first current terminal coupled to a second current terminal of the second MOS transistor, a control terminal coupled to the first current terminal of the third MOS transistor, and a second current terminal coupled to a constant reference potential node; and
   a fourth MOS transistor having a first current terminal coupled to the constant reference potential node, a control terminal coupled to the control terminal of the third MOS transistor, and a second current terminal;
   wherein the second terminal is coupled to receive a power supply voltage generated by a first supply, wherein the first terminal is coupled to receive a chip-enable signal generated by a component powered by a second supply, wherein the second current terminal of the fourth MOS transistor is coupled to a path on which the chip-enable signal is generated.

2. An active circuit comprising a first terminal and a second terminal, the first terminal and the second terminal to receive corresponding voltages for operation of the active circuit, the circuit comprising:
   a first MOS transistor having a first current terminal coupled to the second terminal, a second current terminal coupled to the first terminal, and a control terminal coupled to the first terminal;
   a second MOS transistor having a first current terminal coupled to the second terminal and a control terminal coupled to the control terminal of the first MOS transistor;
   a third MOS transistor having a first current terminal coupled to a second current terminal of the second MOS transistor, a control terminal coupled to the first current terminal of the third MOS transistor, and a second current terminal coupled to a constant reference potential node; and
   a fourth MOS transistor having a first current terminal coupled to the constant reference potential node, a control terminal coupled to the control terminal of the third MOS transistor, and a second current terminal;
   wherein the second terminal is coupled to receive a power supply voltage generated by a first supply, wherein the first terminal is coupled to receive a power supply voltage generated by a second supply, wherein the first supply and the second supply are used for powering corresponding circuit portions of an integrated circuit (IC), wherein the second power supply is switched-ON later than the first power supply, wherein the second current terminal of the fourth MOS transistor is coupled to the first power supply via a resistor, wherein a delayed version of a signal at the second current terminal of the fourth MOS transistor is coupled to a reset terminal of the IC.

3. An active circuit comprising a first terminal and a second terminal, the first terminal and the second terminal to receive corresponding voltages for operation of the active circuit, the circuit comprising:
   a first MOS transistor having a first current terminal coupled to the second terminal, a second current terminal coupled to the first terminal, and a control terminal coupled to the first terminal;
   a second MOS transistor having a first current terminal coupled to the second terminal and a control terminal coupled to the control terminal of the first MOS transistor;
   a third MOS transistor having a first current terminal coupled to a second current terminal of the second MOS transistor, a control terminal coupled to the first current terminal of the third MOS transistor, and a second current terminal coupled to a constant reference potential node; and
   a fourth MOS transistor having a first current terminal coupled to the constant reference potential node, a control terminal coupled to the control terminal of the third MOS transistor, and a second current terminal;
   wherein the second terminal is coupled to receive an unregulated power supply voltage, wherein the first terminal is coupled to receive a regulated power supply voltage, wherein the regulated power supply voltage is generated from the unregulated power supply voltage by a voltage regulator, wherein the second current terminal of the fourth MOS transistor is coupled to the first power supply via a resistor, wherein a signal at the second current terminal of the fourth MOS transistor is coupled to a control block in the voltage regulator to cause the voltage regulator to limit the value of an in-rush current flowing via the voltage regulator.

* * * * *